US011628456B2

(12) United States Patent
Choi et al.

(10) Patent No.: US 11,628,456 B2
(45) Date of Patent: Apr. 18, 2023

(54) APPARATUS FOR INCREASING FLUX FROM AN AMPOULE

(71) Applicant: Applied Materials, Inc., Santa Clara, CA (US)

(72) Inventors: Kenric Choi, San Jose, CA (US); Xiaoxiong Yuan, San Jose, CA (US); Daping Yao, San Jose, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 30 days.

(21) Appl. No.: 17/350,353

(22) Filed: Jun. 17, 2021

(65) Prior Publication Data

US 2021/0308703 A1  Oct. 7, 2021

Related U.S. Application Data

(62) Division of application No. 15/910,398, filed on Mar. 2, 2018, now Pat. No. 11,059,061.

(60) Provisional application No. 62/466,669, filed on Mar. 3, 2017.

(51) Int. Cl.
*C23C 16/448* (2006.01)
*B05B 7/24* (2006.01)
*B05B 7/00* (2006.01)
*B65D 1/09* (2006.01)
*H01L 21/68* (2006.01)
*H01L 21/67* (2006.01)

(52) U.S. Cl.
CPC .......... *B05B 7/2491* (2013.01); *B05B 7/0075* (2013.01); *B65D 1/09* (2013.01); *C23C 16/448* (2013.01); *H01L 21/68* (2013.01); *H01L 21/67017* (2013.01)

(58) Field of Classification Search
CPC ....... B05B 7/2491; B05B 7/0075; B65D 1/09; H01L 21/67017; H01L 21/68; C23C 16/448; C23C 16/4481; C23C 16/18; C23C 16/45565
USPC ...................... 118/723 VE, 726; 156/345.29; 427/248.1
See application file for complete search history.

(56) References Cited

U.S. PATENT DOCUMENTS 5,589,110 A   12/1996  Motoda et al.
6,512,885 B1   1/2003  Yamamuka et al.
(Continued)

FOREIGN PATENT DOCUMENTS

EP         3243927 A1   11/2017
JP      2012251179 A   12/2012
(Continued)

OTHER PUBLICATIONS

PCT International Search Report and Written Opinion in PCT/US2018/020601 dated May 30, 2018, 15 pages.

*Primary Examiner* — Rudy Zervigon
(74) *Attorney, Agent, or Firm* — Servilla Whitney LLC

(57) ABSTRACT

Ampoules for a semiconductor manufacturing precursors and methods of use are described. The ampoules include a container with an inlet port and an outlet port. The inlet port has a showerhead that the end within the container. The showerhead has at least two angled nozzles to direct the flow of gas within the cavity so that the gas flow is not perpendicular to the surface of a liquid within the ampoule.

20 Claims, 3 Drawing Sheets

(56) References Cited

U.S. PATENT DOCUMENTS

| | | | |
|---|---|---|---|
| 7,118,783 B2* | 10/2006 | Carpenter | C23C 16/4481 |
| | | | 118/727 |
| 7,156,380 B2 | 1/2007 | Soininen | |
| 7,186,385 B2 | 3/2007 | Ganguli et al. | |
| 8,382,903 B2 | 2/2013 | Okabe et al. | |
| 2005/0249873 A1 | 11/2005 | Sarigiannis | |
| 2006/0065254 A1* | 3/2006 | Okabe | H01L 21/67109 |
| | | | 123/550 |
| 2008/0182023 A1* | 7/2008 | Spohn | F16J 15/0887 |
| | | | 118/712 |
| 2008/0216743 A1 | 9/2008 | Chen et al. | |
| 2009/0114157 A1 | 5/2009 | Lee et al. | |
| 2010/0112215 A1 | 5/2010 | Cuvalci et al. | |
| 2010/0119734 A1 | 5/2010 | Choi | |
| 2011/0023783 A1 | 2/2011 | Kim et al. | |
| 2013/0205611 A1 | 8/2013 | Wamura et al. | |
| 2015/0053134 A1 | 2/2015 | Lee et al. | |
| 2016/0333477 A1 | 11/2016 | Nehlsen | |
| 2017/0327945 A1 | 11/2017 | Birtcher et al. | |

FOREIGN PATENT DOCUMENTS

| | | |
|---|---|---|
| JP | 5589873 B2 | 9/2014 |
| WO | 2007121202 A1 | 10/2007 |

* cited by examiner

US 11,628,456 B2

APPARATUS FOR INCREASING FLUX FROM AN AMPOULE

CROSS-REFERENCE TO RELATED APPLICATIONS

This application is a divisional of U.S. patent application Ser. No. 15/910,398, filed Mar. 2, 2018, which claims priority to U.S. Provisional Application No. 62/466,669, filed Mar. 3, 2017, the entire disclosures of which are hereby incorporated by reference herein.

TECHNICAL FIELD

The present disclosure relates generally to ampoules for and methods using semiconductor manufacturing precursors. In particular, the disclosure relates to ampoules and methods to provide improved fluxes of precursors.

BACKGROUND

The semiconductor industry is using an increasing variety of chemistries for chemical vapor deposition (CVD) and atomic layer deposition (ALD) processes that come in liquid or solid form. The precursor is typically inside a closed vessel or ampoule with a single inlet and a single outlet.

Precursors with a low vapor pressure frequently use a carrier gas to carry the vapor out of the ampoule to the process reactor. For these types of processes there are two types of ampoules typically used: a bubbler where the inlet carrier gas goes into a tube that is submerged into the precursor; and a cross-flow ampoule where the carrier gas sweeps the headspace in the ampoule. There are situations where a bubbler cannot be used due to entrainment of the precursor nor a cross-flow ampoule because the flux of the precursor does not meet the process parameters.

Therefore, there is a need in the art for ampoules and methods to provide a higher flux of precursor than a cross-flow ampoule.

SUMMARY

One or more embodiments of the disclosure are directed to an ampoule for semiconductor manufacturing precursors. The ampoule comprises a container having a bottom, sidewalls and a lid enclosing a cavity. An inlet port is in fluid communication with the cavity. The inlet port has a showerhead on an end of the inlet port located within the cavity. The showerhead comprises at least two angled nozzle to direct a flow of gas so that when a liquid is present in the container. The flow of gas is not perpendicular to a surface of the liquid. An outlet port is in fluid communication with the cavity.

Additional embodiments of the disclosure are directed to an ampoule for a semiconductor manufacturing precursor. The ampoule comprises a container having a bottom, sidewalls and a lid enclosing a cavity. An inlet port is in fluid communication with the cavity. The inlet port has a showerhead on an end of the inlet port located within the cavity. The showerhead comprises three angled nozzles to direct a flow of gas so that when a liquid is present in the container, the flow of gas from each nozzle is independently in the range of about 5° to about 7° measured relative to a line orthogonal to the surface of the liquid. An outlet port is in fluid communication with the cavity.

Further embodiments of the disclosure are directed to methods of providing a flow of precursor. A carrier gas is flowed through an inlet port of a precursor ampoule having a liquid precursor therein. The flow of carrier gas is directed within the ampoule with a showerhead at an end of the inlet port. The showerhead comprises at least two angled nozzles to direct the flow of gas at an angle not perpendicular to a surface of the liquid precursor. The carrier gas and precursor is flowed out of the ampoule through an outlet port.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label. The cross-hatch shading of the components in the figures are intended to aid in visualization of different parts and do not necessarily indicate different materials of construction.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Some embodiments of the disclosure advantageously provide ampoules with higher flux than cross-flow ampoules. Some embodiments advantageously provide ampoules with a gas flow that does not bubble through the liquid precursor. Some embodiments advantageously provide gas flows that are not orthogonal to the precursor surface.

In some embodiments, a showerhead is provided on an inlet of the ampoule with a plurality of nozzles that are angled over the liquid within. A distance between the level of the liquid and the showerhead is maintained so that the showerhead is not submerged in the liquid.

Figure 1:
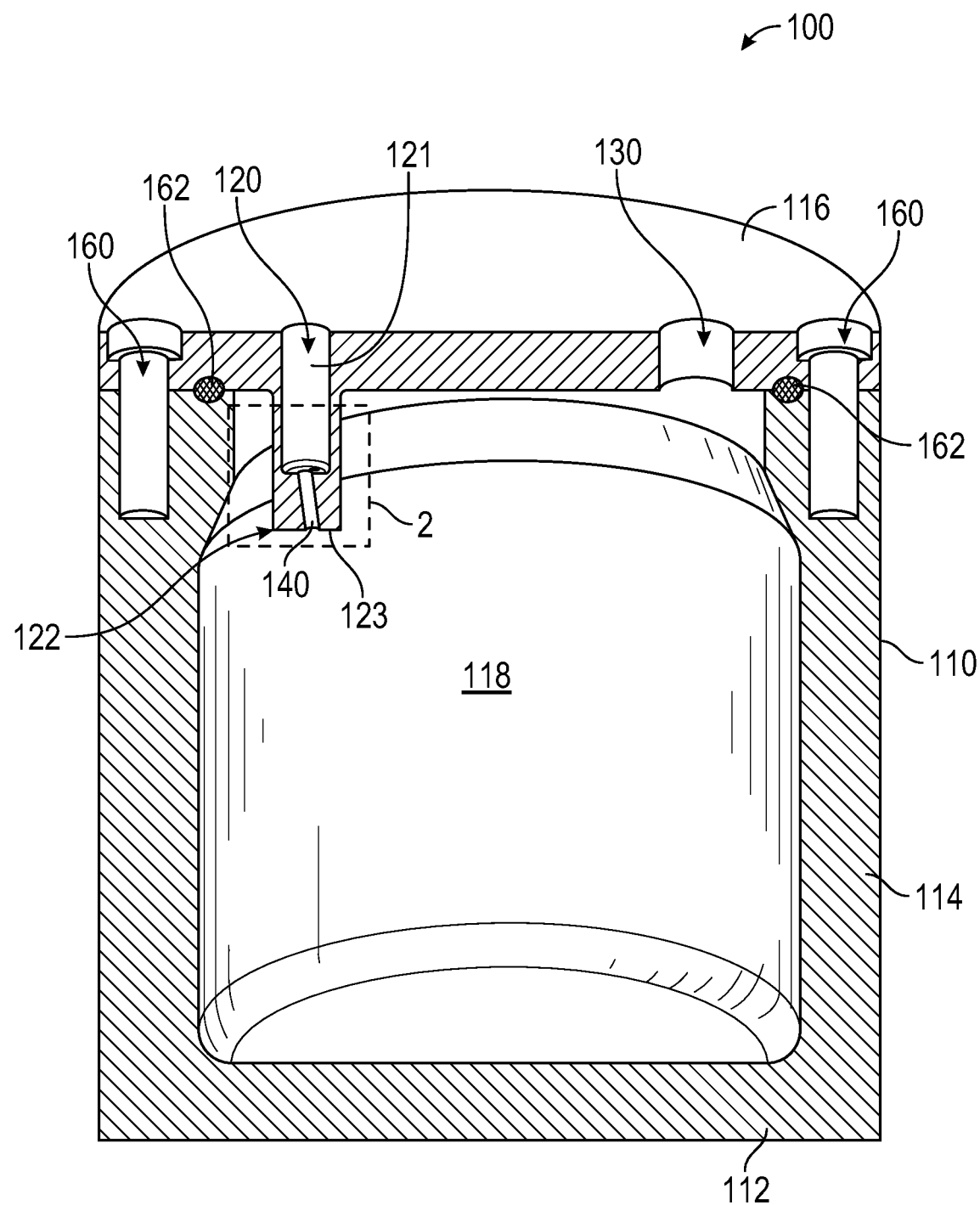
FIG. 1 shows a sectioned view of an ampoule in accordance with one or more embodiment of the discourse.

FIG. 1 shows an ampoule 100 for use with semiconductor manufacturing reagents. The term "precursor" is used to describe the contents of the ampoule 100 and refers to any reagent that flowed into the process environment.

The ampoule 100 includes a container 110 with a bottom 112, sidewalls 114 and a lid 116 enclosing a cavity 118. An inlet port 120 and outlet port 130 are in fluid communication with the cavity 118.

Figure 2:
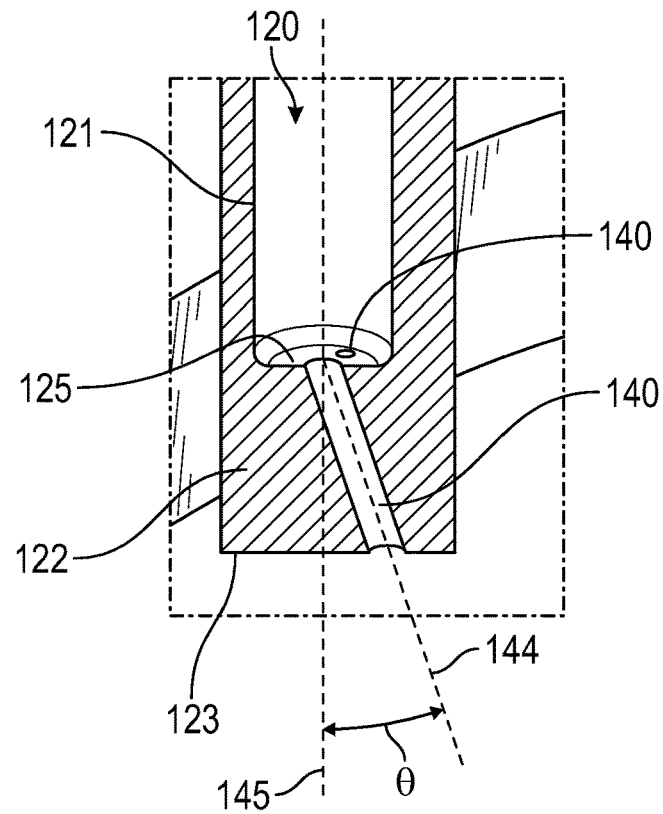
FIG. 2 shows an expanded region 2 of FIG. 1.

The inlet port 120 is generally configured to allow a connection to a gas source and may have suitable threaded or sealing connections. The inlet port 120, as shown in FIGS. 1 and 2, has a passage 121 with an inner diameter defining a cross-sectional width of the passage 121. The passage 121 has a bottom end 125 that can be curved, tapered or come to a flat end.

The inlet port 120 has a showerhead 122 on an end 123 of the inlet port 120 located within the cavity 118. The showerhead 122 is the portion of the inlet port 120 located between the bottom end 125 of the passage 121 and the end 123 of the inlet port 120. The showerhead 122 comprises at least two angled nozzles 140 to direct a flow of gas 141. The number of nozzles 140 in the showerhead 122 can be in the range of about 2 to about 24, or in the range of about 2 to about 18, or in the range of about 2 to about 12, or in the range of about 2 to about 10 or in the range of about 2 to about 8, or in the range of about 2 to about 6, or in the range of about 2 to about 4. In some embodiments, there are three nozzles 140 in the showerhead 122.

Figure 3:
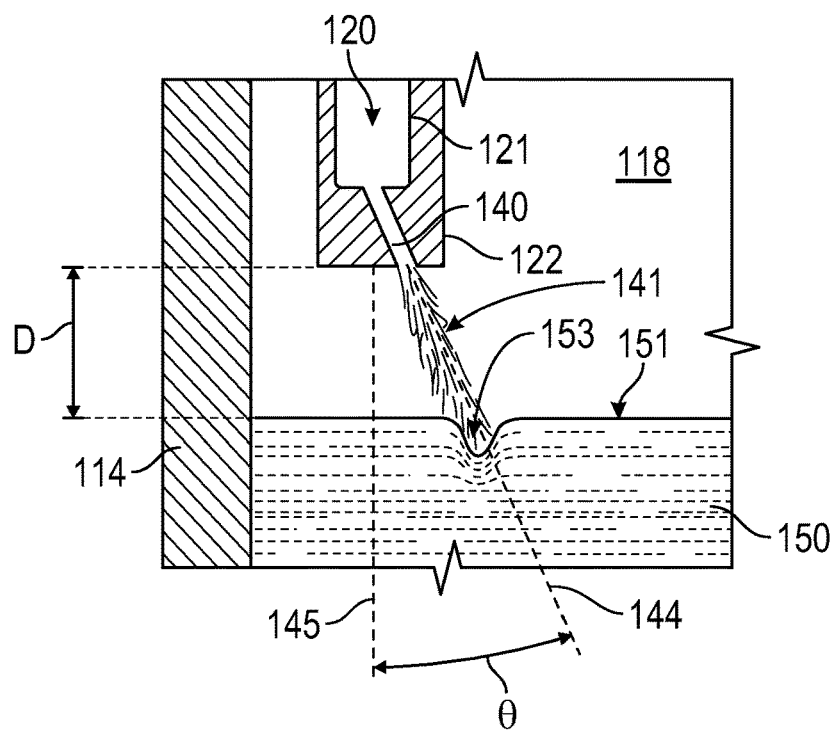
FIG. 3 shows a partial cross-sectional of an ampoule in accordance with one or more embodiment of the disclosure.

The nozzles 140 are configured to provide an angled flow of gas 141, measured relative to a line orthogonal to the surface 151 of a liquid 150 within the ampoule 100. With reference to FIGS. 2 and 3, each nozzle 140 has axis 144 that is directed at an angle θ relative to the line orthogonal 145 to the surface 151.

The angle θ can be any suitable angle that is not perpendicular to the surface 151 of the liquid 150. Each nozzle 140 can have a difference angle θ than any other nozzle 140. In some embodiments, the angle θ is greater than 1°, 2°, 3° or 4° relative to the line orthogonal 145 to the surface 151. In some embodiments, the angle θ is in the range of about 2° to about 25°, or in the range of about 2.5° to about 15°, or in the range of about 3° to about 12°, or in the range of about 4° to about 10°, or in the range of about 5° to about 7°. In some embodiments, the flow of gas exiting the nozzle is not perpendicular to the surface 151 of a liquid 150 within the container 110.

An outlet port 130 is also in fluid communication with the cavity 118 in the container 110. The outlet port 130 is generally configured to be able to connect to a line to allow the gases exiting the container 110 to flow to a processing chamber (or other component). The outlet port 130 may have a threaded connection to allow a gas line to be connected.

In some embodiments, as shown in FIG. 1, the lid 116 is a separate component from the bottom 112 and sidewalls 114. The lid 116 can be connected to the sidewalls 114 of the container 110 using removable bolts through appropriately shaped openings 160. The openings 160 may have a threaded portion to allow for easy connection of a threaded bolt. The bolts can be removed to allow the lid 116 to be removed from the container 110 so that the precursor in the container 110 can be changed or added. In some embodiments, the container 110 includes an O-ring 162 positioned between the lid 116 and the sidewalls 114 to form a fluid tight seal.

Figure 4:
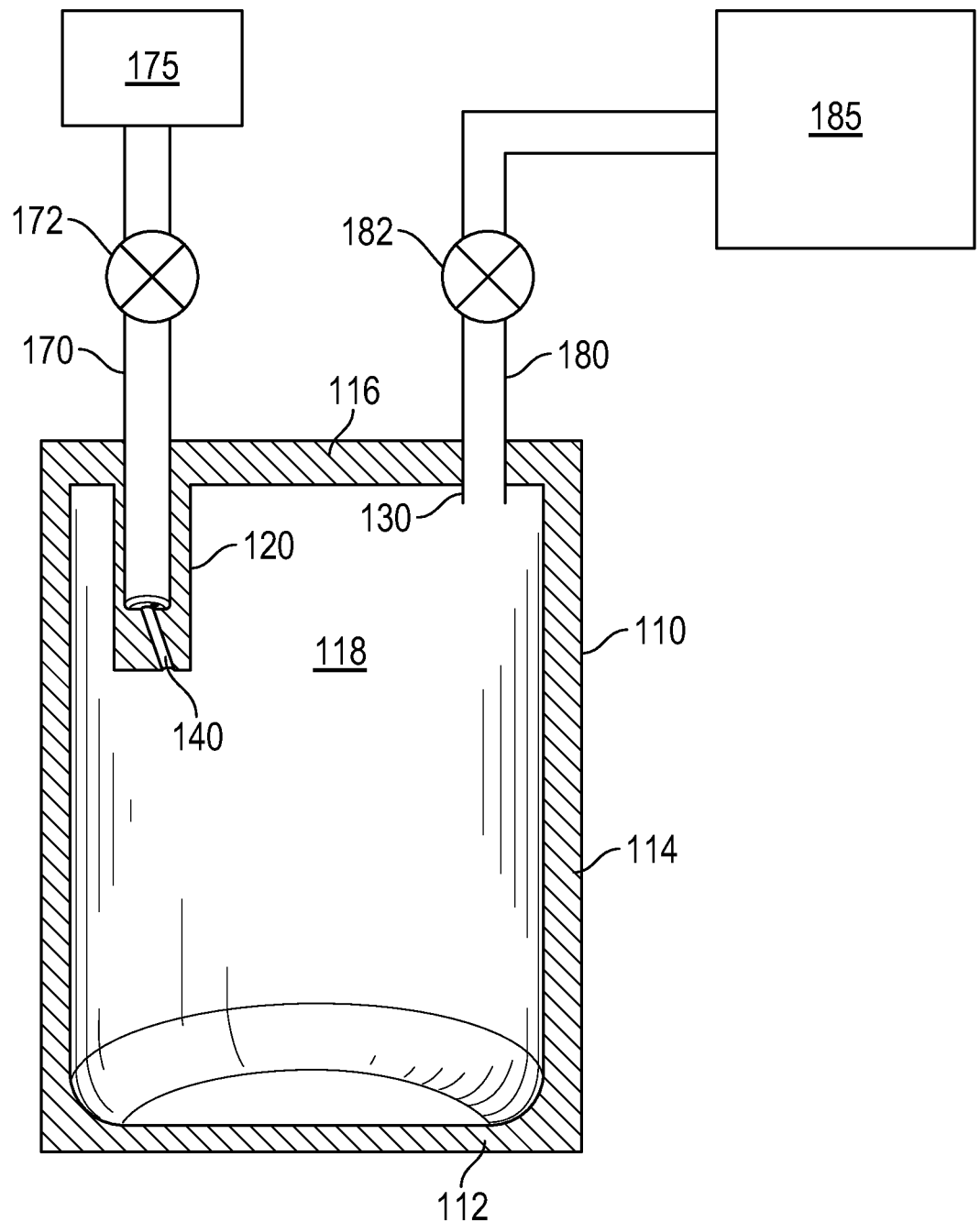
FIG. 4 shows a schematic view of an ampoule and plumbing in accordance with one or more embodiment of the disclosure.

In some embodiments, as shown in FIG. 4, the lid 116 can be integrally formed with the sidewalls 114 and bottom 112 of the container 110. Different plumbing configurations can be connected to the lid 116 to allow the ampoule 100 to be added to a process chamber. In some embodiments, an inlet line 170 is connected to the inlet port 120. An inlet valve 172 can be positioned on the inlet line 170 between gas source 175 and the inlet port 120. The inlet valve 172 can be integrally formed with the lid 116 or connected to the lid 116 as a separate component. An outlet line 180 can be connected to the outlet port 130. The outlet line 180 of some embodiments includes an outlet valve 182 located between the outlet port 130 and the processing chamber 185. The inlet valve 172 and outlet valve 182 can be used to isolate the ampoule 100 so that the contents of the cavity 118 are isolated from the environment outside of the container 110. In some embodiments, there are multiple valves along the inlet line 170 and/or the outlet line 180. The valves 172, 182 can be manual valves or pneumatic valves.

In some embodiments, the ampoule 100 includes a liquid 150 within the cavity 118. The liquid 150 can be a precursor for use with a semiconductor manufacturing process. The liquid 150 of some embodiments comprises dicobalt hexacarbonyl tert-butylacetylene (CCTBA).

Referring to FIG. 3, the distance D of the showerhead 122 to the surface 151 of the liquid 150 can vary over time and use of the precursor. As the precursor is used, the volume within the container 110 will decrease so that the distance D increases. The distance D is sufficient to prevent the showerhead 122 from contacting or being submerged in the liquid 150.

In some embodiments, the gas flow 141 through the inlet port 120 and showerhead 122 is sufficient to disturb a liquid/gas interface of the liquid precursor without bubbling. In some embodiments, disturbing the liquid/gas interface forms a dimple 153 in the surface 151 of the liquid 150. The dimple 153 can have a depth up to about 3 mm. In some embodiments, the dimple has a depth (measured from the surface 151) that is greater than or equal to about 0.1 mm. In some embodiments, the dimple 153 has a depth less than or equal to about 2.5 mm, 2 mm, 1.5 mm, 1 mm or 0.5 mm. The gas flow 141 can be adjusted during processing as the level of liquid 150 decreases to maintain a sufficient disturbance of the liquid/gas interface. The gas flow 141 of some embodiments, has a maximum velocity sufficient to prevent condensation of the liquid 150 at the outlet port 130.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of providing a flow of precursor, the method comprising:
flowing a carrier gas through an inlet port of a precursor ampoule having a liquid precursor therein,
directing the flow of the carrier gas within the ampoule with a showerhead at an end of the inlet port, the showerhead comprising at least two angled nozzles to direct the flow of gas at an angle not perpendicular to a surface of the liquid precursor; and flowing the carrier gas and precursor out of the ampoule through an outlet port, wherein the ampoule comprises a container having a bottom, sidewalls, and a lid, and the end of the inlet port is located a first orthogonal distance from the lid and the outlet port is located a second orthogonal distance from the lid, and the first orthogonal distance is larger than the second orthogonal distance.

2. The method of claim 1, wherein the flow of carrier gas is sufficient to disturb a liquid/gas interface of the liquid precursor without bubbling through the liquid precursor.

3. The method of claim 2, wherein the disturbing of the liquid/gas interface forms a dimple in the surface of the liquid precursor, the dimple having a depth less than or equal to about 1 mm.

4. The method of claim 1, wherein the flow of carrier gas has a maximum velocity to prevent condensation at the outlet port.

5. The method of claim 1, wherein the nozzles are independently angled in a range of about 2° to about 25° measured relative to a line orthogonal to the surface of the liquid precursor.

6. The method of claim 1, wherein all of the nozzles are in direct fluid communication with a bottom end of a gas passage defined by the inlet port.

7. The method of claim 6, wherein the gas passage defined by the inlet port is in direct fluid communication with a gas source.

8. A method of providing a flow of precursor, the method comprising:

flowing a carrier gas through an inlet port of a precursor ampoule having a liquid precursor therein, the inlet port having at least two angled nozzles through an end of the inlet port located within a cavity of the ampoule;

directing the flow of the carrier gas within the through the at least two angled nozzles to direct the flow of the carrier gas from any of the angled nozzles at an angle not perpendicular to a surface of the liquid precursor; and flowing the carrier gas and the precursor out of the ampoule through an outlet port, wherein the cavity is defined by a container having a bottom, sidewalls, and a lid, and the end of the inlet port is located a first orthogonal distance from the lid and the outlet port is located a second orthogonal distance from the lid, and the first orthogonal distance is larger than the second orthogonal distance.

9. The method of claim 8, wherein the flow of carrier gas is sufficient to disturb a liquid/gas interface of the liquid precursor without bubbling through the liquid precursor.

10. The method of claim 9, wherein the disturbing of the liquid/gas interface forms a dimple in the surface of the liquid precursor, the dimple having a depth less than or equal to about 1 mm.

11. The method of claim 8, wherein all of the nozzles are in direct fluid communication with a bottom end of a gas passage defined by the inlet port.

12. The method of claim 11, wherein the gas passage defined by the inlet port is in direct fluid communication with a gas source.

13. The method of claim 1, wherein the liquid precursor comprises dicobalt hexacarbonyl tert-butylacetylene.

14. The method of claim 8, wherein the liquid precursor comprises dicobalt hexacarbonyl tert-butylacetylene.

15. The method of claim 1, wherein the nozzles are independently angled in the range of about 3° to about 12° measured relative to a line orthogonal to the surface of the liquid when the liquid is present.

16. The method of claim 8, wherein the nozzles are independently angled in the range of about 3° to about 12° measured relative to a line orthogonal to the surface of the liquid when the liquid is present.

17. The method of claim 1, wherein the nozzles are independently angled in the range of about 4° to about 10° measured relative to a line orthogonal to the surface of the liquid when the liquid is present.

18. The method of claim 8, wherein the nozzles are independently angled in the range of about 4° to about 10° measured relative to a line orthogonal to the surface of the liquid when the liquid is present.

19. The method of claim 1, wherein the nozzles are independently angled in the range of about 5° to about 7° measured relative to a line orthogonal to the surface of the liquid when the liquid is present.

20. The method of claim 8, wherein the nozzles are independently angled in the range of about 5° to about 7° measured relative to a line orthogonal to the surface of the liquid when the liquid is present.

* * * * *